(12) United States Patent
Wright et al.

(10) Patent No.: US 7,158,056 B2
(45) Date of Patent: Jan. 2, 2007

(54) METHOD AND APPARATUS FOR SCANNING A KEY OR BUTTON MATRIX

(75) Inventors: David G. Wright, Escondido, CA (US); Ray Asbury, Eagle, ID (US)

(73) Assignee: Cypress Semiconductor Corporation, San Jose, CA (US)

(*) Notice: Subject to any disclaimer, the term of this patent is extended or adjusted under 35 U.S.C. 154(b) by 208 days.

(21) Appl. No.: 10/888,666

(22) Filed: Jul. 8, 2004

(65) Prior Publication Data

US 2006/0007023 A1    Jan. 12, 2006

(51) Int. Cl.
*H03M 11/20* (2006.01)
(52) U.S. Cl. .................. 341/26; 345/168; 340/14.1
(58) Field of Classification Search .............. 341/20, 341/26; 345/168; 340/14.1
See application file for complete search history.

(56) References Cited

U.S. PATENT DOCUMENTS 5,274,371 A * 12/1993 Yang et al. ................. 341/26
5,872,561 A *  2/1999 Figie et al. ............... 345/168

* cited by examiner

*Primary Examiner*—Albert K. Wong
(74) *Attorney, Agent, or Firm*—Marger Johnson & McCollom, P.C.

(57) ABSTRACT

An improved key matrix scanning technique conducts a first pre-scan on a first array of connections in a key matrix to identify any activated keys or buttons associated with the first array. A second sub-scan is conducted on a second array of connections in the key matrix but only for the connections in the first array that are detected as having activated keys.

19 Claims, 7 Drawing Sheets

(BACKGROUND)

FIG. 4 (PRE-SCAN)

(SUB-SCAN)

METHOD AND APPARATUS FOR SCANNING A KEY OR BUTTON MATRIX

BACKGROUND

FIG. 1 shows how a typical keyboard matrix 12 is constructed. Two thin sheets 14 and 16 of plastic or polymer material have printed conductive traces 18 and 20, respectively. The traces 18 and 20 are arranged such that when pressure is applied at certain locations, such as when keys 22 on a keyboard are pressed, one trace on sheet 14 makes an electrical connection with one trace 20 at the corresponding location on the other sheet 16.

Typically, the sheets 14 and 16 are separated by a third sheet 24 with no printed traces. The third sheet 24 includes holes 26 aligned with the positions of buttons 22. When no pressure is applied to the area above the holes 26, the conductive traces 18 and 20 do not make contact. When one of the keys 22 is pressed, one of the traces 18 on sheet 14 is pushed through the corresponding hole 26 making an electrical contact with one of the traces 20 on sheet 16. The electrical cross-connection between the trace 18 and the trace 20 is associated with a particular key or button 22. The information associated with the identified key or button 22 is forwarded to a computer, processor, or other computing device.

For clarity, only a small number of row and columns traces are shown in FIG. 1. The traces 18 and 20 on the two printed sheets 14 and 16 are arranged so that each trace 18 on the upper sheet 14 crosses each trace 20 on the lower sheet 16 over a hole 26 only once. In this way, each button 22 on the keyboard will make a single unique contact between one of the traces 18 on the upper sheet 14 and one of the traces 20 on the lower sheet 16. Typically, one sheet has eight traces referred to as key matrix rows and the other sheet has between 16 and 24 traces referred to as key matrix columns. In this way, an 8×16–24 key matrix is formed, with each button 22 corresponding to a single cross-connection point in the matrix.

Generally, a metal sheet (usually connected to electrical ground) is placed underneath the bottom sheet 16 in order to provide mechanical rigidity and to help prevent electrostatic discharge events. Since the resistivity of the conductive ink used to print the traces 18 and 20 is quite high, the printed traces are quite wide, typically in the order of around 2 millimeters (mm) wide.

Due to the size of most keyboards, the traces 18 and 20 are also quite long, particularly the row traces which may "zig-zag" back and forth across the length of the keyboard in order to cross each of the column traces. Lengths of over 0.5 meters (m) are common. Because of the relatively high resistivity, the impedance of the traces 18 and 20 may be 10 ohms per square (s), or up to a couple of hundred ohms. The combination of the trace width and length, the thinness of the polymer sheets 14 and 16, and the proximity of the metal grounding sheet creates a significant capacitance in the traces 18 and 20.

Typically, keyboards contain a microcontroller having Input/Output (I/O) pins connected to the row and column traces 18 and 20. The microcontroller applies signals to the I/O pins and senses the signals on other I/O pins to detect actuation of the keyboard buttons 22. Digital logic or firmware is typically used to execute this process. This arrangement is also used in applications other than keyboards, for example remote controls, where the state of many keys must be detected.

The firmware or logic senses which, if any, buttons 22 are being pressed starts by first connecting a pull-up resistance between each of the row traces and a high voltage, for example 5 volts (V). Typically this resistance is contained within an I/O cell of a Microcontroller Unit (MCU) pin connected to the row traces. The MCU I/O pins connected to the columns are typically held in a high-impedance state. A first column, such as column 0 in FIG. 2 is then driven with a low voltage. The MCU then reads the logic state of the 8 rows for column 0. If all the rows have a logic "1" state, then the firmware infers that no buttons are pressed on the first column 0 of the matrix.

If one or more of the rows have a logic "0" state, the MCU infers that the buttons are pressed corresponding to the cross-connection locations in the matrix corresponding to column 0 and the rows having the logic 0 state. The column 0 is returned to the high impedance state and the process is repeated for each of the remaining columns 1-n. The MCU periodically repeats this entire process driving each column to a known logic state and then scanning each row for the known logic state.

The MCU then also conducts some post processing for any detected key presses. For example, simultaneously pressing three keys located in a right-angled triangle shape relative to each other in the key matrix will cause a fourth "phantom" key press to be detected. The firmware post-processes the list of detected key presses and executes an algorithm to remove any possible "phantom" keys from its list of pressed keys.

The pull-up resistances need to be significantly higher than the impedance of the longest trace so that when one end of the trace is grounded, the output of the voltage divider formed by the trace and pull-up resistor is a low voltage. Typically, pull-up resistances are around 10 thousand (k) ohms.

Because of the significant capacitance of the traces 18 and 20, and relatively high pull-up resistances, the time constant of the formed Resistance/Capacitance (RC) is typically around 10 microseconds (us). After a column pin is driven low, it is therefore necessary to monitor each cross connection in the key matrix for a significant amount of time (t) as shown in FIG. 2. Sometimes this time delay needs to be as much as 100 us to ensure the state of the row I/O pins correctly reflect the state of the associated keys 22 (FIG. 1).

The time required to scan an entire scan 8×20 key matrix used in a typical Personal Computer (PC) keyboard is therefore the time (t) multiplied by the number of columns (n). The total scan time is therefore (n×t) and can be as much as 2 milliseconds (ms). In a normal wired keyboard, where power is provided by the computer attached to the keyboard, this is not a significant problem. However, in battery powered keyboards, particularly wireless keyboards, it is desirable to maximize battery life.

In order to detect and filter key bounce, the key matrix is typically scanned every 10 ms. For a 2 ms total scan period, the MCU therefore performs the matrix scanning algorithm as much as 20% of the time the keyboard is in active use.

A typical wireless keyboard consumes an average of 2–3 milli Amps (mA) when in active use. To save energy, the MCU is placed in a low power sleep mode when not actively scanning the matrix, processing the results of each scan, and transmitting data associated with key presses (if any). The typical current use by the MCU in this type of application is around 3 mA when active (i.e., executing instructions). However, the current use is negligible while in the sleep mode. Thus, the average current attributable to the process of scanning the matrix is around 600 uA (20% of 3 mA). This amounts to 20–30% of the overall current consumption of the keyboard.

These existing methods of keyboard matrix scanning are slow, consume too much power, and prevent the MCU from performing other tasks for a significant period of time while scanning the matrix. The present invention addresses this and other problems associated with the prior art.

SUMMARY OF THE INVENTION

An improved key matrix scanning technique conducts a first pre-scan on a first array of connections in a key matrix to identify any activated keys or buttons associated with the first array. A second sub-scan is conducted on a second array of connections in the key matrix but only for the connections in the first array that are detected as having activated keys.

The foregoing and other objects, features and advantages of the invention will become more readily apparent from the following detailed description of a preferred embodiment of the invention which proceeds with reference to the accompanying drawings.

DETAILED DESCRIPTION

Figure 1:
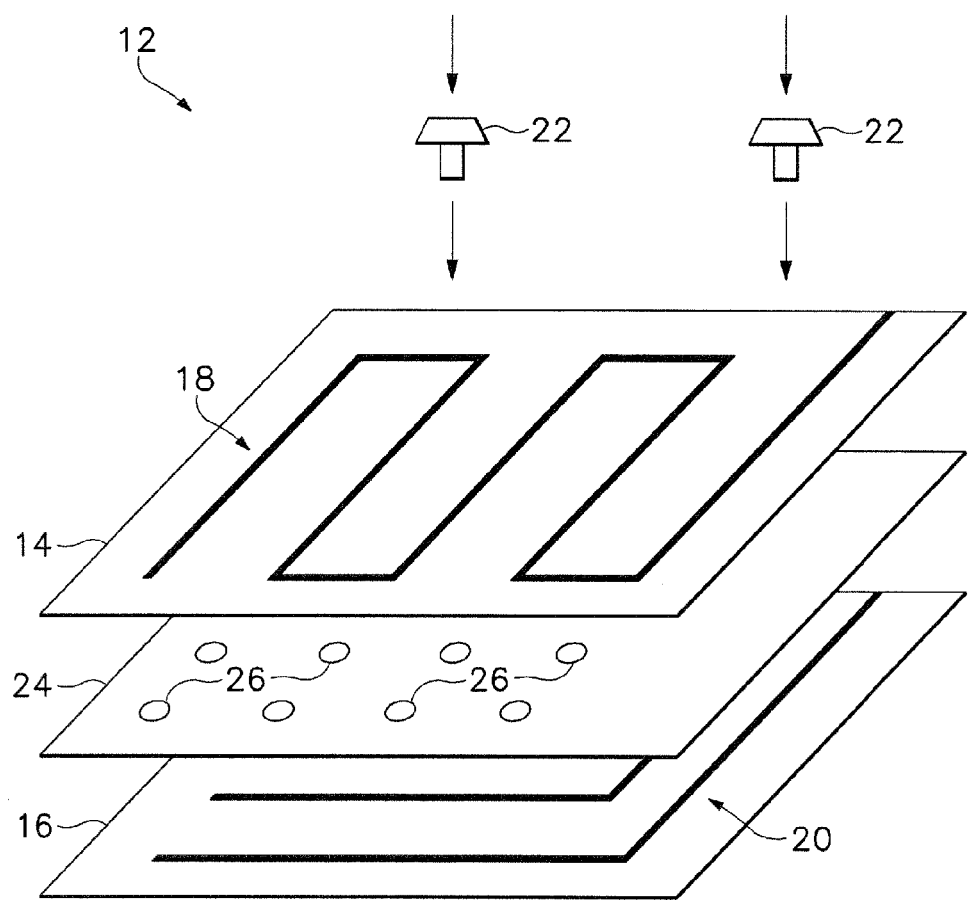
FIG. 1 is a diagram of a key matrix.
Figure 2:
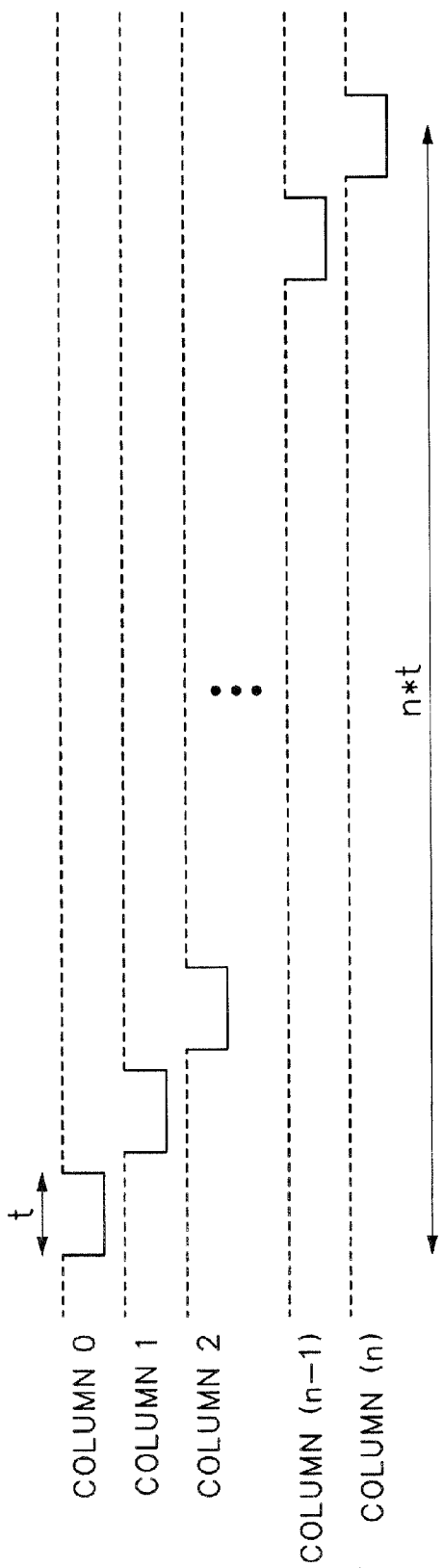
FIG. 2 is a timing diagram showing how the key matrix in FIG. 1 is scanned.
Figure 3:
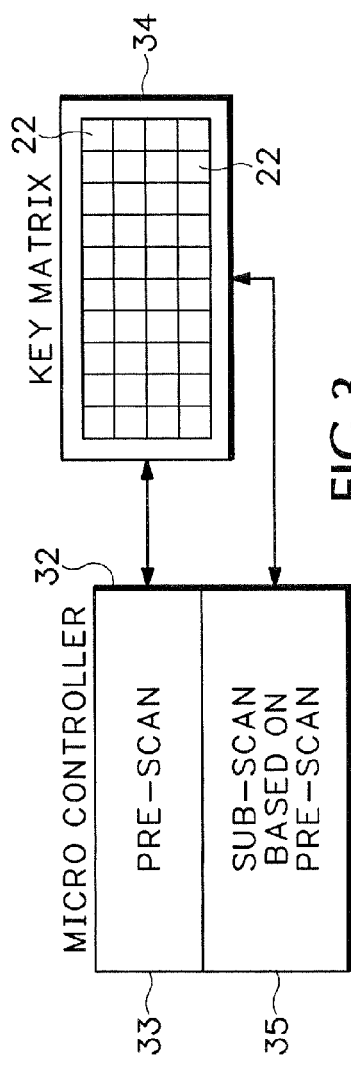
FIG. 3 is a block diagram showing an improved key matrix scanning system.

FIG. 3 shows an improved key matrix scanning system 30. The scanning system 30 can increase battery life of a wireless keyboard and other types of remote control and battery operated devices by reducing the time required for a Microcontroller Unit (MCU) 32 to scan a key matrix 34.

The MCU 32 can be any type of programmable processing device. In other embodiments, the MCU 32 is firmware such as a Programmable Logic Device (PLD) that is hard coded to perform the operations described below. The key matrix 34 can be any circuitry used for sensing depression of keys or buttons on a user control device. The terms keys and buttons are used interchangeably in the description below and refer to any type of actuation device used for communicating a user input to a computing device.

Typically only one button 22 is pressed at a time on a keyboard or keypad used with the key matrix 34. In other cases, two keys 22 are pressed at the same time. Only in rare cases, amounting to a negligible proportion of the time that the key matrix 34 is in use, are more than two key or buttons 22 pressed at the same time.

The MCU 32 quickly determines during a pre-scan routine 33 which columns, if any, of the key matrix 34 have active keys (e.g., depressed keys). Rather than scanning all columns, the MCU 32 conducts a second sub-scan 35 only for the columns identified with active keys during the pre-scan 33. If only one column is detected with active keys during the first column pre-scan, then the row sub-scan is conducted only for that one identified column during the second sub-scan. If two keys are detected as pressed during the pre-scan, then the second sub-scan is conducted only for the two columns detected with pressed keys.

This is an improvement over current scanning techniques that scan the rows of the key matrix for every column. The time taken to determine which columns have pressed keys is approximately the same amount of time required to scan a single column. Thus, if only one key is detected as depressed during the pre-scan, the time taken to scan a 20-column matrix is reduced by 90%. If two keys are detected as depressed during the pre-scan, the time taken to scan the matrix is reduced by 85%.

Figure 4:
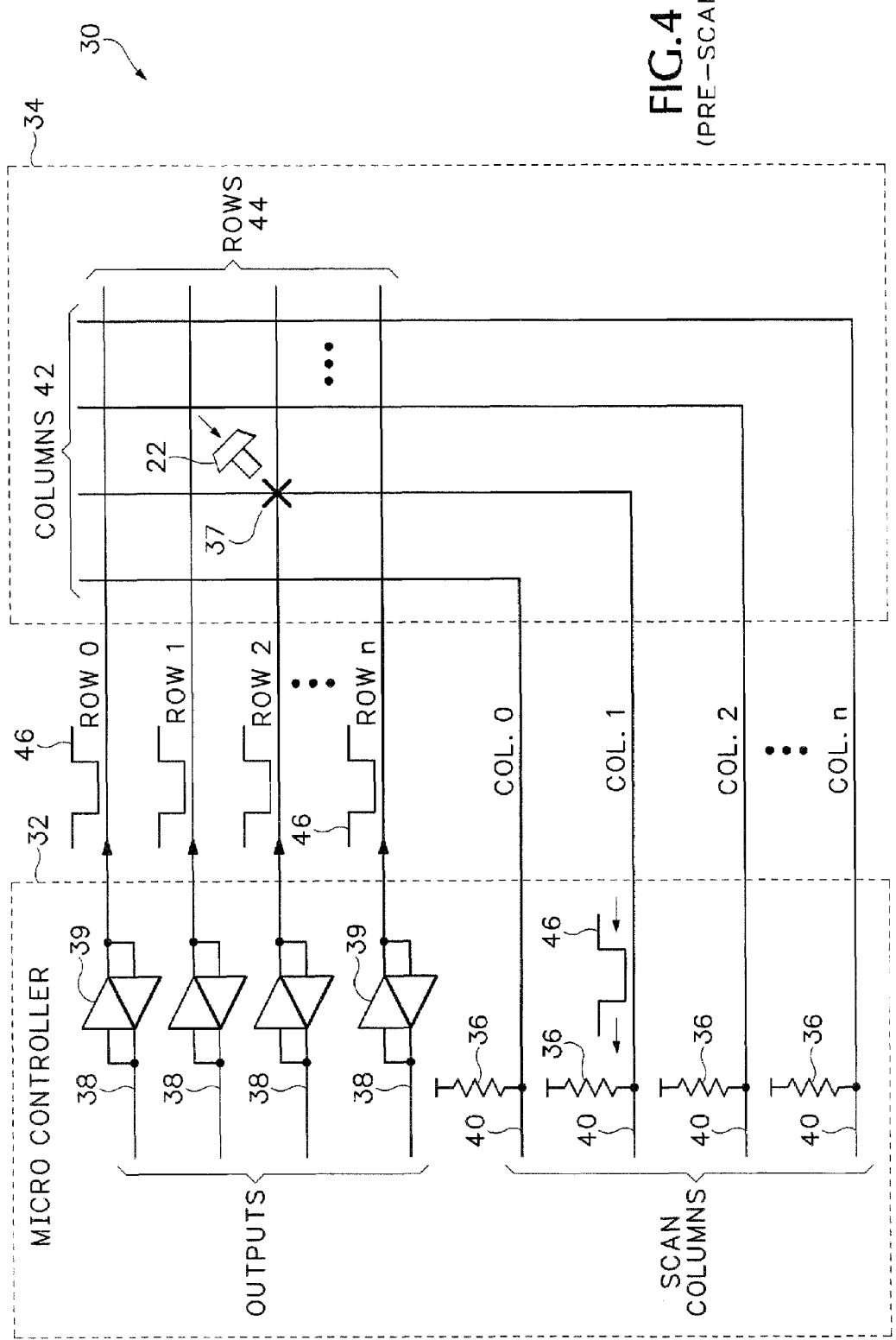
FIG. 4 is a more detailed diagram of the circuitry used for conducting a first pre-scan.

FIG. 4 shows one example of a configuration used for the scanning system 30 of FIG. 3 for conducting the first pre-scan operation 33. The key matrix 34 is shown as an array of columns connections 42 and row connections 44. However, it should be understood that this is for illustrative purposes and the two overlapping etch patterns for connections 42 and 44 may not physically be aligned in columns and rows. The intent is to illustrate that the connections 42 and 44 overlap and the cross-connections between connections 42 and 44 are created by depression of a key or button. For example, cross connection 37 is created when a key 22 located above the intersection between row 2 and column 1 is depressed. The pins 40 on the MCU 32 or connected to column connections 42 and pins 38 are connected to row connections 44.

In the pre-scan configuration in FIG. 4, the MCU 32 configures the pins 40 as inputs. Pull-up resistors 36 are connected to columns 42, pulling the columns 36 to logic high states. The MCU 32 configures I/O buffers 39 so that the pins 38 operate as outputs. It should be understood that the pull-up resistors 36 can be internal to the MCU 32 or can be discrete interface circuitry that is separate from the MCU 32.

During the pre-scan, the MCU 32 generates logic low signals 46 on the pins 38 and monitors the signals received on the pins 40. In this example, the MCU 32 detects a key or button 22 is depressed at cross-connection location 37 in the key matrix 34 when the logic low signal 46 is detected on the column 1 connection. Since there are no other pressed keys, the other column connections 0 and 2-n remain in a logic high state during the pre-scan operation.

Figure 5:
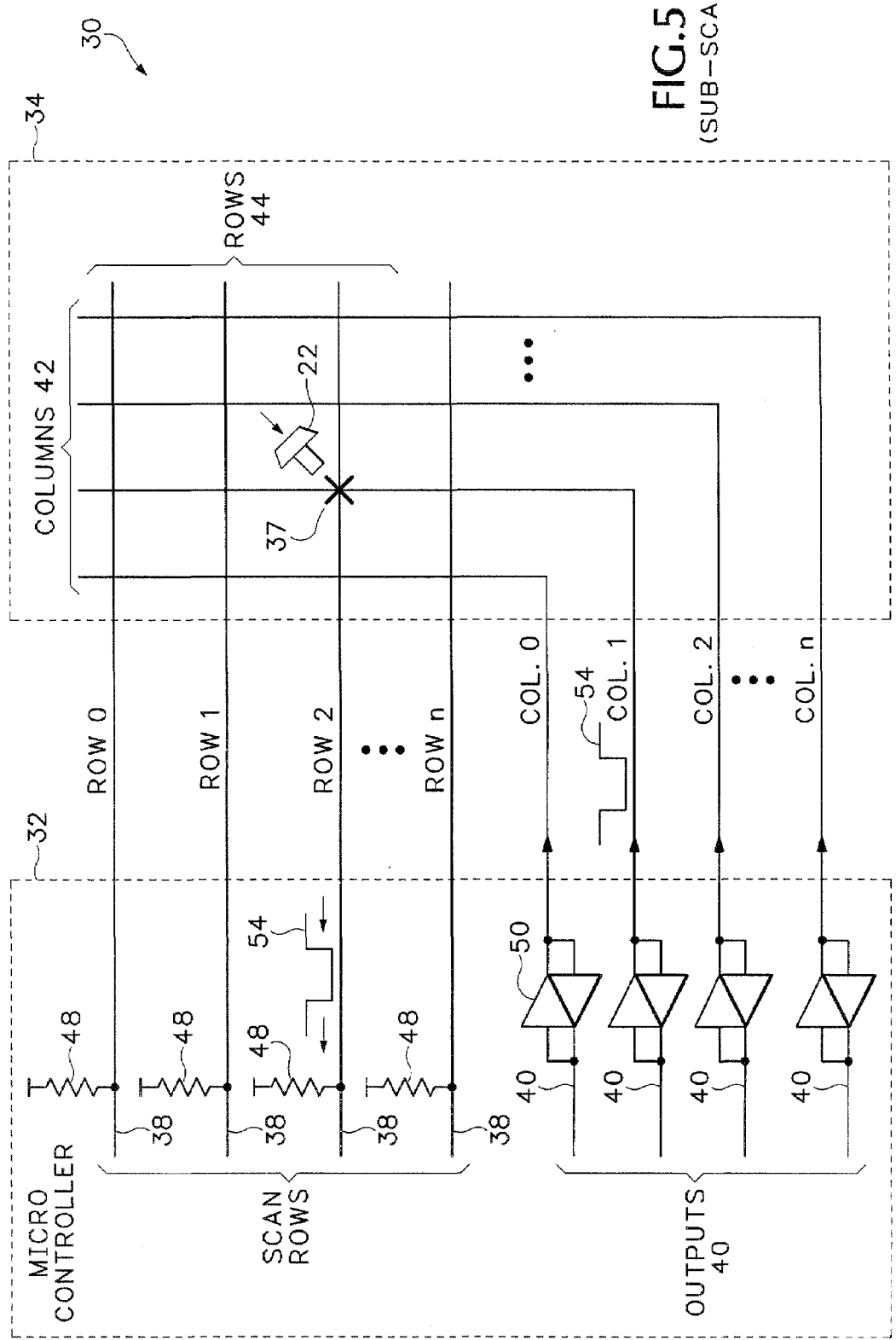
FIG. 5 is a diagram of the circuitry in FIG. 4 configured for conducting a second sub-scan.

FIG. 5 shows the configuration of the scanning system 30 for the second sub-scan operation 35. The MCU 32 configures the I/O buffers 50 connected to the pins 40 as outputs and configures the I/O buffers 39 (FIG. 4) connected to pins 38 as inputs. In this example, the MCU 32 connects pull-up resistors 48 to the pins 38 pulling all of the rows 44 to known logic high states. The MCU 32 then generates a logic low ("0") pulse only on the columns connections 42 where a logic 0 pulse was previously detected during the pre-scan operation in FIG. 4.

In this example, a logic low signal 46 was only detected on column 1 in FIG. 4. Therefore, a logic low signal 54 is only generated for column connection 1 in FIG. 5. The MCU 32 scans the rows 44 for the logic low signal 54. Since there is only one cross-connection 37 established in the key matrix 34 by depressed key 22, the logic low signal 54 will only be detected on row 2. The MCU 32 determines that the key 22 associated with row 2 and column 1 has been depressed and sends the information to an associated host device. The MCU 32 has determined which key has been depressed without having to generate logic signals 54 on column connections 0 and 2-n and then having to scan all the rows 44 for each column 0 and 2-n.

It should be understood that this is just one example and it is not necessary that the pins 38 and 40 have to be connected to pull-up resistors or that logic zero signals have to be asserted on the rows and columns. Alternatively, pull-down resistors could be used and logic 1 values asserted on the column and row connections.

Further, the pull-up or pull-down resistors may not necessarily be internal to the MCU 32. In alternative embodiments, the resistors may be located in separate circuitry from the MCU 32. In another embodiment, the logic in the MCU 32, I/O buffers 39 and 50, and the resistors 36 and 48 are partially or all implemented in different combinations of integrated circuitry and discrete logic circuitry.

Figure 6:
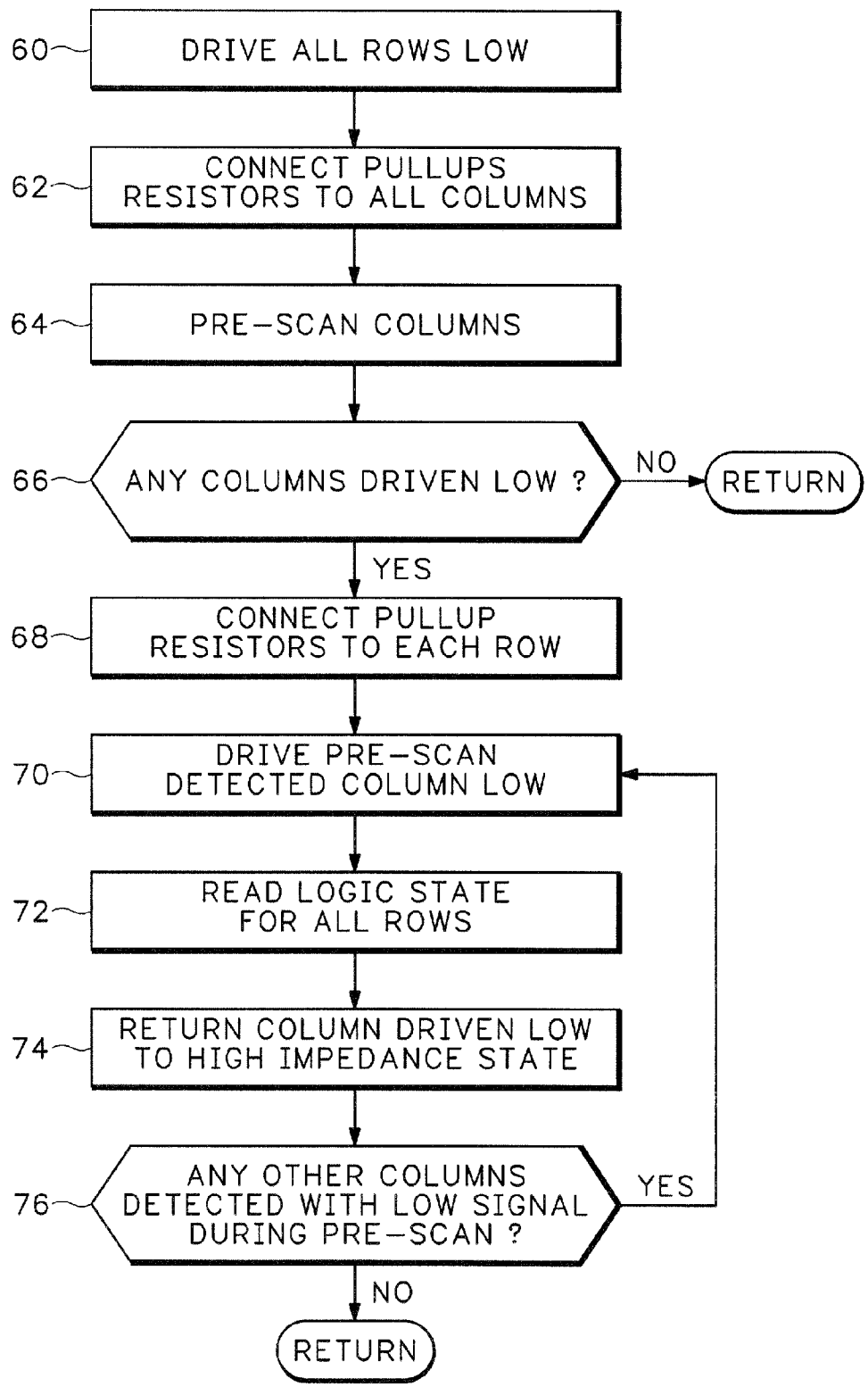
FIG. 6 is a block diagram showing how the circuitry in FIGS. 4 and 5 conduct the pre-scan and sub-scan.

Referring to the flow diagram in FIG. 6 and FIGS. 4 and 5, the MCU 32 in block 60 drives all row connections 44 to logic 0 states with signals 46 and connects pull-up resistors 36 to the column connections 42 (FIG. 4). The MCU 32 waits some delay period to allow for charging or discharging of trace capacitance. For example, the MCU 32 may wait for around 100 us. The MCU 32 in block 64 then conducts the pre-scan operation by reading the logic state of each column connection 42. If all columns have a logic 1 state in block 66, no keys are pressed, and the rest of the process is skipped. The MCU 32 returns and waits for the next pre-scan operation.

If a logic low state is detected on a column connection 42 in block 66, the MCU 32 in block 68 begins the sub-scan operation by connecting the pull-up resistors 48 in FIG. 5 to pins 38. The first column detected with a logic 0 signal during the pre-scan operation is driven low at the MCU I/O pins 40 in block 70. The MCU 32 reads the logic state for all of the row connections 44 in block 72. The MCU 32 infers that a button is depressed corresponding to the location, such as cross-connection location 37 in FIG. 5, corresponding to the column and the row detected with logic 0 states. The column driven low in block 70 is returned to a high impedance state in block 74. The MCU 32 then repeats the operation in blocks 70–74 for each of the other columns, if any, where a logic 0 state was detected in block 66. The MCU 32 creates a list of pressed keys that is then post-processed in a manner similar to conventional keyboard processing.

Figure 7:
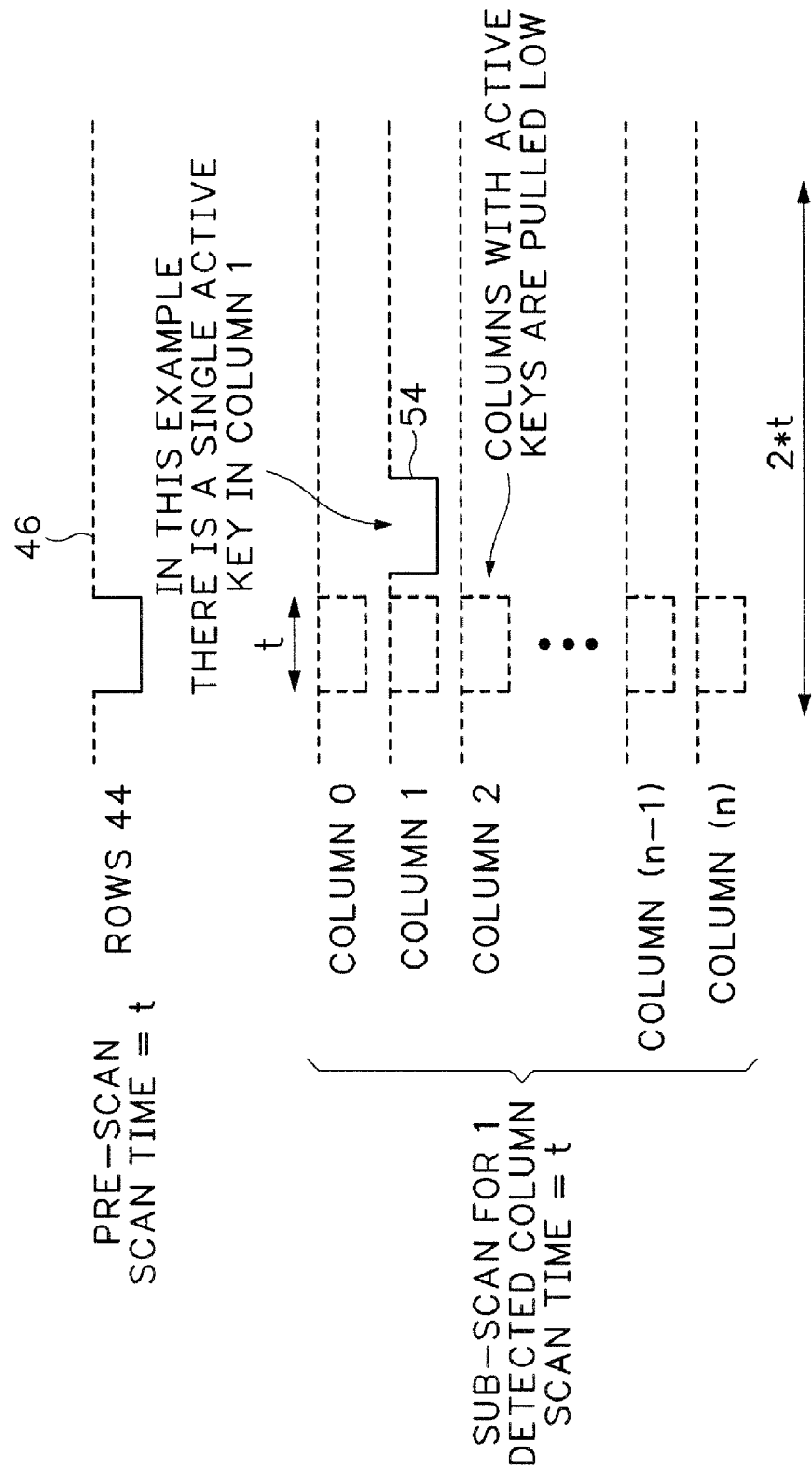
FIG. 7 is a timing diagram showing how the scan time is reduced for the improved key matrix scanning.

FIG. 7 shows how the overall scan time is reduced by first conducting the column pre-scan. In the traditional matrix scanning scheme, there are as many delays as there are columns, regardless of how many keys are pressed. FIG. 7 shows an example where all the columns are scanned for the first logic low signal 46 applied to all rows 44. The time required to scan all columns 42 during the pre-scan operation is (t).

In this example, only column 1 was detected with a logic low signal. Therefore, only one row scan is required for the logic low signal 54 applied to column 1. This single row scan for column 1 operation only requires a single delay time t. Thus, the total scan time for the example shown in FIG. 7 is (2*t).

The improved scanning technique therefore reduces the number of delays to 1+(the number of columns with keys pressed). Typically the time taken to perform each operation is much less than the delay time. Thus, for a 20-column key matrix 34, the scan time is reduced by 95% when no keys are pressed, 90% when one key is pressed, 85% when two keys are pressed ... etc. Only if 20 keys are pressed, and each key is on a different column, will the scan time increase, and only by 5%.

When no keys are pressed, the MCU 32 will generally be in a sleep mode and is not scanning the key matrix 34. Before going into the sleep mode, the MCU 32 may perform the pre-scan operation in blocks 60–64 (FIG. 6) and enable an interrupt on a low-going transition on all I/O pins connected to matrix columns 42. Therefore, if any key is pressed, an interrupt is generated causing the MCU 32 to wake up from the sleep mode and start the scanning operations.

The "no keys pressed" condition will generally only be detected once per keystroke, immediately after the last key pressed is released. The most frequent scan result will be one key pressed. The second most common will be no keys pressed; the third most common will be two keys pressed, and three or more keys pressed is unusual.

Figure 8:
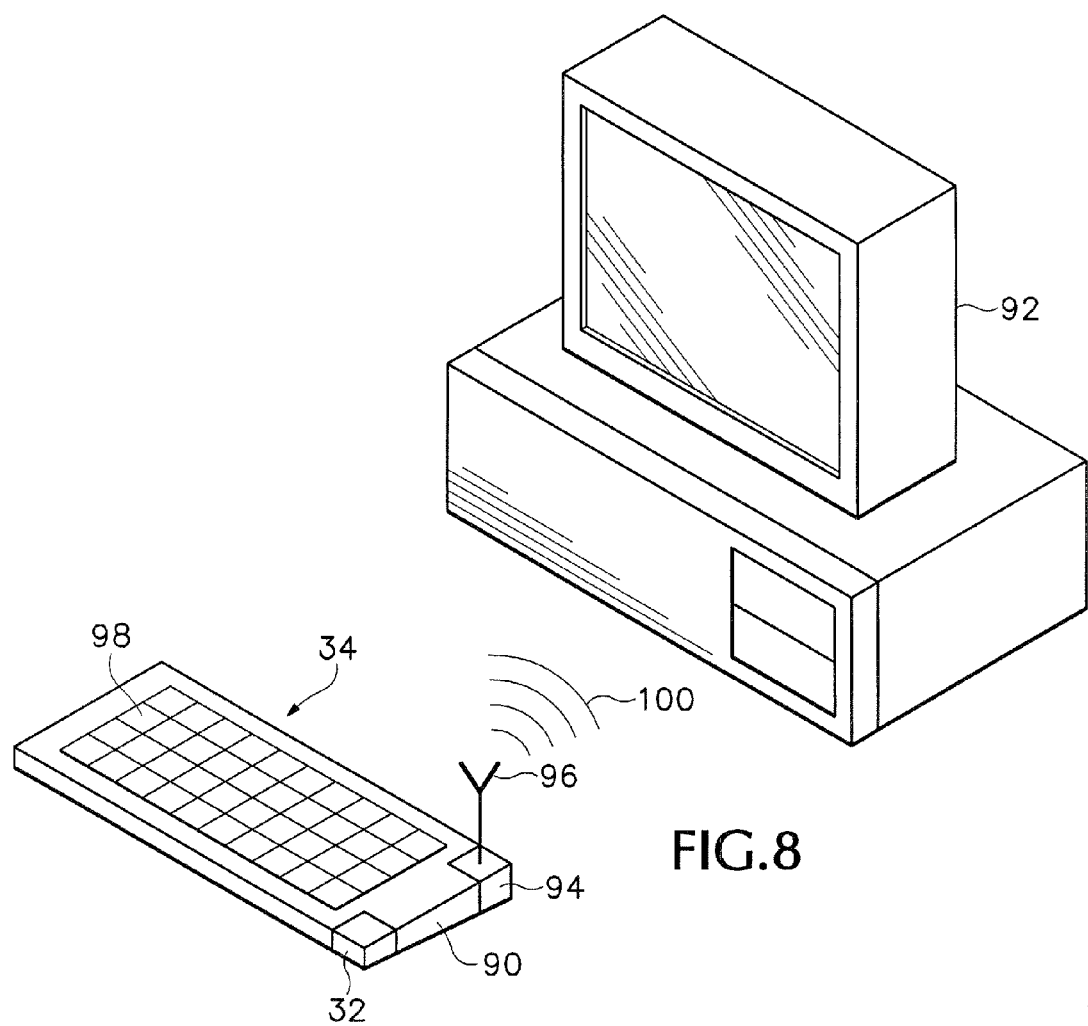
FIG. 8 is a system diagram showing one example of an application for the improved key matrix scanning.

FIG. 8 shows a wireless keyboard 90 that includes the MCU 32 that conducts the improved key matrix scan. The wireless keyboard 90 includes a keyboard 98 that includes keys or buttons that are depressed by a user. The key matrix 34 is contained underneath the keyboard 98. The MCU 32 periodically scans the key matrix 34 and identifies any depressed keys on keyboard 98 as described above.

The MCU 32 sends the key information to a wireless transmitter 94 that includes an antenna 96 that wirelessly transmits the depressed key information 100 to some sort of computing device 92. The computing device 92 than takes some sort of appropriate action in response to the information represented by the key information 100.

In one example, the pre-scan operation reduces the time spent scanning the key matrix 34 by around 95%. This reduces the average current consumption attributable to scanning from 600 micro Amps (uA) to 30 uA for the example described above. In the case of a wireless keyboard with an average active current of 2.5 mA, the power reduction is around 23%. This translates into around a 30% increase in battery life.

ALTERNATIVE EMBODIMENTS

Wireless keyboards 90, remote controls, and other keypad devices are the most common applications where it would be advantageous to reduce the key matrix scan time. However, there are other cases where reduced scan time is also useful. For example, in a wired keyboard with some combined other functions, such as a Universal Serial Bus (USB) keyboard hub. In such cases, the MCU 32 has other operations to perform in addition to scanning the key matrix and transmitting the keyboard data. These other operations may take up most of the MCU processing power, either all the time or when processing an event related to the other functionality. In these cases, reducing the time spent scanning the key matrix 34 frees up the MCU 32 for performing other processing.

The improved key matrix scanning operation greatly reduces MCU scan time. This reduces the overall average power consumption since the MCU can spend a greater proportion of time in a low power sleep mode. The improved scanning system in one application reduces power consumption of Wireless USB keyboards, such as keyboard 90 in FIG. 8, improving its competitive position over wired keyboards.

The system described above can use dedicated processor systems, micro controllers, programmable logic devices, or microprocessors that perform some or all of the operations.

Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention may be modified in arrangement and detail without departing from such principles. I claim all modifications and variation coming within the spirit and scope of the following claims.

The invention claimed is:

1. A method of scanning a connection matrix, comprising:
   conducting a first pre-scan of either the rows or columns connections of the connection-matrix to identify rows or columns with activated keys or buttons; and
   conducting a second sub-scan of the connection-matrix to identify a particular connection in the rows or columns with activated keys or buttons wherein only the rows or columns identified as having activated keys or buttons in the pre-scan are scanned.

2. The method according to claim 1 wherein the first pre-scan scans the column connections and the second sub-scan scans only the row connections with activated keys or buttons identified from the pre-scan.

3. The method according to claim 2 including:
   driving a first pre-scan signal on the row connections;
   monitoring the column connections for the pre-scan signal; and
   identifying any column connections deleted with the pre-scan signal as having activated keys or buttons.

4. The method according to claim 3 including:
   driving a second sub-scan signal only on the column connections identified with activated keys or buttons;
   monitoring all the row connections for the sub-scan signal;
   identifying the row connections with by detecting the sub-scan signal; and
   identifying the keys or buttons depressed by associating the detected sub-scan signal with a key or button in the matrix.

5. The method according to claim 1 including:
   connecting each of the column connections to a known impedance state;
   applying a first known voltage to each of the row connections;
   sensing the voltage on the column connections that does not have a voltage applied;
   generating a list of column connections that have the first known voltage;
   connecting each of the row connections to the known impedance state;
   applying the first known voltage only on the column connections identified in the list;
   sensing the voltage on each of the row connections to identify the activated key.

6. The method according to claim 5 including:
   applying the first known impedance state through a pull-up resistance; and
   applying the first known voltage having an different logic value than the first known impedance state.

7. The method according to claim 1 including:
   placing a microcontroller or logic in a low power sleep mode;
   periodically walking up the microcontroller or logic for a time to conduct the pre-scan and the sub-scan;
   identifying the pressed keys or buttons according to the pre-scan and the sub-scan; and
   placing the microcontroller or logic back into to the sleep mode until a next periodic pre-scan and sub-scan.

8. The method according to claim 1 including conducting pre-scan and sub-scan in a wireless keyboard and wirelessly transmitting any identified pressed keys or buttons to a host processing device.

9. The method according to claim 1 including:
   configuring the row connections as outputs and the column connections as inputs during the pre-scan; and
   configuring the column connections as outputs and the row connections as inputs during the sub-scan.

10. A circuit for monitoring a connection-matrix, comprising:
    processing circuitry configured to conduct a first scan of the rows of the connection-matrix to identify activated connections in particular columns and then conduct a second scan of only the columns identified in the first scan as having activated connections to identify particular activated connections in the connection-matrix.

11. The circuit according to claim 10 including logic circuitry that during the first scan puts the columns in a first high impedance logic state and applies a second logic state to the rows.

12. The circuit according to claim 11 wherein the logic circuitry during the second scan puts the rows in the high impedance logic state and applies the second logic state only to the columns identified in the first scan as having activated connections.

13. The circuit according to claim 10 wherein the logic circuitry comprises pull-up or pull-down resistance.

14. The circuit according to claim 10 wherein the processing circuitry includes bi-directional connections coupled to the rows and columns of the matrix, the bidirectional connections operating as inputs to the rows and outputs to the columns during the first scan and the bi directional connections operating as outputs to the rows and inputs to the columns during the second scan.

15. The circuit according to claim 10 wherein the circuitry is contained in a wireless keyboard and includes a wireless keyboard transmitter for sending key or button information to a computer associated with the keyboard.

16. The circuit according to claim 10 wherein the processor repeatedly goes into a sleep mode for a period of time and then periodically and repeatedly wakes-up to conduct the first and second scans.

17. A system for detecting the actuation of keys or buttons comprising:
    a matrix including connections corresponding to the rows of keys or buttons and a of connections corresponding to the columns of keys or buttons; and
    processing circuitry configured to conduct a first scan of either the rows or columns of the connection-matrix to identify activated connections in particular columns or rows and then conduct a second scan of only the rows or columns identified in the first scan as having activated connections to identify particular activated keys or buttons in the connection-matrix.

18. The system according to claim 17 including a bi-directional interface that uses the row connections as inputs and the column connections as au-outputs for the first scan and uses the column connections as inputs and the row connections as outputs for the second scan.

19. The system according to claim 18 including logic circuitry that sets the row connections to a first known logic state and then drives the column connections to a second logic state during the first scan, the logic circuitry setting the column connections to the first known logic state during the second scan and then applying the second logic state only to the row connections detected as having the second logic state during the first scan.

* * * * *